United States Patent
Schneider et al.

(10) Patent No.: US 7,042,773 B2
(45) Date of Patent: May 9, 2006

(54) INTEGRATED CIRCUIT FOR STORING OPERATING PARAMETERS

(75) Inventors: Ralf Schneider, München (DE); Jürgen Auge, Unterhaching (DE); Stephan Schröder, München (DE); Manfred Pröll, Dorfen (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 11/008,159

(22) Filed: Dec. 10, 2004

(65) Prior Publication Data

US 2005/0135163 A1 Jun. 23, 2005

(30) Foreign Application Priority Data

Dec. 11, 2003 (DE) ................. 103 58 038

(51) Int. Cl.
*G11C 16/04* (2006.01)
(52) U.S. Cl. ................. 365/189.09; 365/189.03
(58) Field of Classification Search .......... 365/189.05, 365/189.03
See application file for complete search history.

(56) References Cited

U.S. PATENT DOCUMENTS

| | | | |
|---|---|---|---|
| 4,419,747 A | 12/1983 | Jordan | |
| 5,903,504 A * | 5/1999 | Chevallier et al. | 365/189.07 |
| 6,002,627 A | 12/1999 | Chevallier | |
| 6,452,825 B1 * | 9/2002 | Keeth et al. | 365/51 |
| 6,456,557 B1 * | 9/2002 | Dadashev et al. | 365/185.09 |
| 2002/0034097 A1 * | 3/2002 | Banks | 365/185.03 |

* cited by examiner

*Primary Examiner*—Tuan T. Nguyen
(74) *Attorney, Agent, or Firm*—Edell, Shapiro & Finnan, LLC

(57) ABSTRACT

An integrated circuit includes a programming circuit (10) for generating programming signals (PS1, ..., PS4) with a first input terminal (E1) for applying a control voltage (ES), a second input terminal (E2) for applying a reference voltage (Vref), a storage circuit (30) with programmable switches (35, ..., 38) and output terminals (A1, ..., A4). The programming circuit in each case generates a programming signal (PS1, ..., PS4) when the control voltage (ES) exceeds a predefined threshold voltage formed from the reference voltage. The number of programming signals (PS1, ..., PS4) is dependent on the magnitude of the threshold voltage exceeded by the control voltage (ES). The programming signals are used for programming the programmable switches (35, ..., 38). The programming state of the programmable switches can be read out via the output terminals (A1, ..., A4) of the integrated circuit. The integrated circuit enables the storage of external operating parameters of the integrated circuit.

15 Claims, 4 Drawing Sheets

INTEGRATED CIRCUIT FOR STORING OPERATING PARAMETERS

CROSS REFERENCE TO RELATED APPLICATIONS

This application claims priority under 35 USC §119 to German Application No. DE 103 58 038.7, filed on Dec. 11, 2003, and titled "Integrated Circuit for Storing Operating Parameters," the entire contents of which are hereby incorporated by reference.

FIELD OF THE INVENTION

The present invention relates to an integrated circuit for storing operating parameters.

BACKGROUND

The characteristic parameters specified in the data sheet of a semiconductor memory, for example of a DRAM (—Dynamic Random Access Memory) semiconductor memory, are only guaranteed by the manufacturer if the memory chip is operated within specified limits of operating parameters. Such operating parameters include, e.g., the permissible supply voltage range in which the semiconductor memory is permitted to be operated. If a higher voltage than the voltage specified in the data sheet is applied, this may result in the destruction of components on the chip, which leads to the failure of the semiconductor memory. Further operating parameters specified by the manufacturer are for example the permissible ambient temperature range in which proper functioning of the semiconductor memory is guaranteed, and also the permissible clock frequencies at which the semiconductor memory is to be operated.

If devices fail when they are in the customer's possession, they are generally returned to the manufacturer in order for the manufacturer to determine the reason for the failure in the context of a fault analysis. In this case, it is desirable to ascertain whether the failure of the semiconductor memory is attributable to deficiencies in the manufacturer's fabrication process or to the memory chip being operated by the customer in a manner not conforming to the specification. Operating a memory chip in a manner not conforming to the specification includes, for example, overclocking a DRAM, operating the DRAM at impermissibly high voltages or operating the DRAM at excessively high or excessively low temperatures. However, the fault pattern of a device often does not permit unambiguous conclusions about the cause of the failure. Therefore, it would be desirable for the manufacturer to have reliable information available about the operating conditions of the device in the customer's possession.

Furthermore, knowledge of operating parameters of a semiconductor memory can advantageously be used for optimizing modules or else further peripherals of the semiconductor memory. The distribution of the temperature loading of the individual chips on a module is predefined by system variables such as, for example, by the position of a fan on the main circuit board of a computer. If it is possible to determine the distribution of the maximum temperature loading on a module of, for example, a DIMM, then this information can be used to optimize the position of specific components on the module, so that, by way of example, one device is not blocked from the air stream of a fan by another device.

Knowledge of operating parameters under the influence of which a device has failed furthermore enables the test range, for example the temperature range in which devices are exposed to high or low temperatures, to be determined in a manner adapted to the application. By way of example, the intended function of a semiconductor memory according to the data sheet is guaranteed only in a certain temperature range. In the manufacturer's test bed, the devices are generally exposed to higher or lower temperatures and then subjected to a functional test again. By testing the device with a specific temperature margin above or below the specified temperature range, this overcritical testing permits the manufacturer a certain safeguard against failures of the device on account of temperature loading. If the manufacturer knows the actual temperatures to which the device is exposed in the case of the respective customer applications, the temperature range to be tested can be determined more precisely on the part of the manufacturer and be better adapted to the customer's application.

SUMMARY OF THE INVENTION

An object of the present invention is to provide an integrated circuit with storage of operating parameters of the integrated circuit.

The above and other objects are achieved in accordance with the present invention.

In accordance with one embodiment of the present invention, an integrated circuit for storing operating parameters includes a programming circuit with a first input terminal for applying a control voltage, a second input terminal for applying a reference voltage and output terminals for generating a respective programming signal, including first controllable switches, including a storage circuit with programming terminals, output terminals and programmable elements, and also including second controllable switches and output terminals. A respective one of the output terminals of the programming circuit can be connected to a respective one of the programming terminals of the storage circuit, for the purpose of generating the programming signals, via a respective one of the first controllable switches. Furthermore, a respective one of the output terminals of the storage circuit can be connected to a respective one of the output terminals of the integrated circuit via a respective one of the second controllable switches. The programming circuit is formed in such a way that the number of programming signals is dependent on the magnitude of the control voltage. Furthermore, the programmable elements of the storage circuit can be programmed in a manner dependent on the programming signals.

In a second embodiment of the invention, the first input terminal for applying the control voltage is formed as a terminal for applying a supply potential.

In another embodiment of the invention, the integrated circuit comprises a signal converter circuit with an input terminal for applying an input signal and an output terminal for generating an output voltage. The output terminal of the signal converter circuit is connected to the first input terminal of the programming circuit for applying the control signal. The signal converter circuit converts an information item contained in the input signal, for example an information item about the magnitude of the frequency of a signal, into an output voltage and feeds the latter to its output terminal.

In a further embodiment of the invention, the signal converter circuit is formed in such a way that it generates an output voltage in a manner dependent on a temperature of the integrated circuit at its output terminal. In this refinement, the signal converter circuit comprises a temperature sensor for recording the temperature of the integrated circuit. The temperature of the integrated circuit is a chip temperature. It is dependent on the operating conditions of the integrated circuit, such as, by way of example, on the clock frequency at which it is operated, or, alternatively, on influences of the immediate surroundings of the integrated circuit.

In still another embodiment of the invention, the signal converter circuit is formed in such a way that it generates an output voltage in a manner dependent on a frequency of a clock signal of the integrated circuit at its output terminal. In this refinement, the input terminal of the signal converter circuit is formed as a terminal for applying the clock signal of the integrated circuit.

In a still further embodiment of the invention, the programming circuit for generating the programming signals comprises a first comparator circuit and a second comparator circuit. Each of the first and second comparator circuits includes a first input terminal, a second input terminal and an output terminal. The first input terminal of the first comparator circuit is connected to a terminal for applying a reference potential via the series circuit comprising a first and a second resistor. The first input terminal of the second comparator circuit is connected to the first input terminal of the first comparator circuit via the first resistor and to the terminal for applying the reference potential via the second resistor. Furthermore, the output terminal of each of the first and second comparator circuits is respectively connected to a respective one of the output terminals of the programming circuit.

In a first embodiment of the programming circuit of the integrated circuit according to the invention, the first input terminal of the first and second comparator circuits is respectively formed as a terminal for applying a respective partial voltage of the control voltage. The first input terminal of the first comparator circuit is connected to the first input terminal for applying the control voltage of the programming circuit. Furthermore, the second input terminal of the first and second comparator circuits is respectively connected to the terminal for applying the reference voltage of the programming circuit. The partial voltages of the control voltage that are present in each case at the first input terminal of the comparator circuits arise as a result of corresponding voltage drops at the voltage divider formed from the first and second resistors. By way of example, the total control voltage is present at the first input terminal of the first comparator circuit. A lower partial voltage of the control voltage is then present at the first input terminal of the second comparator circuit, depending on the resistance ratio of the first and second resistors. The first and second comparator circuits in each case generate a programming signal at their output terminals if the respective partial voltage of the control voltage that is present at the first input terminal exceeds the reference voltage present at the second input terminal. Depending on the magnitude of the control voltage, a programming signal in each case occurs at a different number of output terminals of comparator circuits. In this refinement of the programming circuit, the first input terminals of the first and second comparator circuits are formed as noninverting terminals. The second input terminals of the first and second comparator circuits are formed as inverting terminals.

In a second embodiment of the programming circuit of the integrated circuit according to the invention, the first input terminal of the first and second comparator circuits is respectively formed as a terminal for applying a respective partial voltage of the reference voltage. The first input terminal of the first comparator circuit is connected to the terminal for applying the reference voltage of the programming circuit. The second input terminal of the first and second comparator circuits is respectively connected to the input terminal for applying the control voltage of the programming circuit. The voltage divider formed from the first and second resistors thus generates respective partial voltages of the reference voltage which are present in each case at the first input terminals of the comparator circuits. The first and second comparator circuits in each case generate a programming signal at their output terminals if the respective partial voltage of the reference voltage that is present at the first input terminal of the programming circuit exceeds the control voltage present at the second input terminal of the programming circuit. Depending on the magnitude of the control voltage, a programming signal thus in each case occurs at a different number of output terminals of comparator circuits. In this refinement of the programming circuit, the first input terminals of the first and second comparator circuits are formed as inverting terminals. The second input terminals of the first and second comparator circuits are formed as noninverting terminals.

Optionally, the programming circuit may be embodied as a complex analog/digital converter. In this case, additional threshold voltages can be defined. The value of the control voltage can be resolved even more finely by the use of such an analog/digital converter.

In still a further embodiment of the integrated circuit according to the invention, the storage circuit comprises a terminal for applying a supply voltage and third controllable switches. The terminal for applying the supply voltage can be connected to the terminal for applying the reference potential via the series circuit comprising a respective one of the third controllable switches and a respective one of the programmable switches. Furthermore, a respective one of the output terminals of the storage circuit can be connected to the terminal for applying the reference potential via a respective one of the programmable switches.

In a further embodiment of the integrated circuit according to the invention, one of the output terminals of the programming circuit for generating a respective programming signal can be connected to one of the output terminals of the integrated circuit via one of the second controllable switches. The reference voltage present at the second input terminal can thereby be set to the switching threshold of the comparator circuit connected to said output terminal.

In yet another embodiment of the integrated circuit according to the invention, the programmable switches are formed as electrically programmable nonvolatile memory elements. The programmable switches can also be formed as fusible links.

In an additional embodiment of the invention, the terminal for applying the reference potential is formed as a terminal for applying a ground potential.

The above and still further objects, features and advantages of the present invention will become apparent upon consideration of the following detailed description of specific embodiments thereof, particularly when taken in conjunction with the accompanying drawings wherein like reference numerals in the figures are utilized to designate like components.

DETAILED DESCRIPTION

Figure 1:
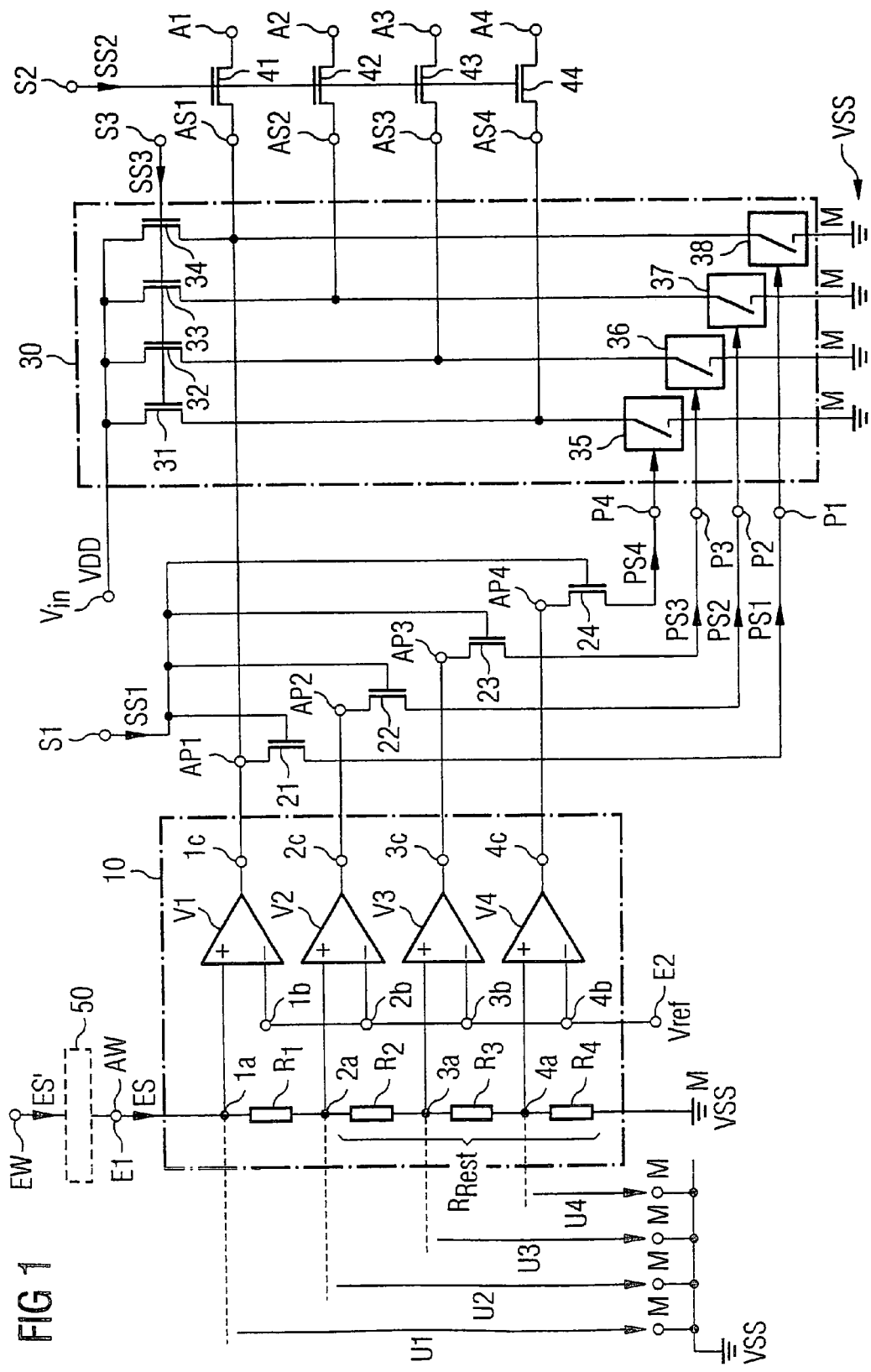
FIG. 1 shows an exemplary embodiment of an integrated circuit according to the invention.

FIG. 1 shows a first embodiment of an integrated circuit for storing operating parameters of the integrated circuit. Exemplary operating parameters of the integrated circuit include, without limitation, the clock frequency at which the integrated circuit is operated, the ambient temperature of the integrated circuit and the supply voltage applied to the integrated circuit. The below-described exemplary embodiment of the integrated circuit for storing the operating parameters makes it possible to ascertain, for example, the exceeding of four preset threshold values of the clock frequency, the ambient temperature or the applied supply voltage. In this case, the four threshold values can be preset by means of the ratio of four resistors R1, . . . , R4. In the exemplary embodiment, the integrated circuit is restricted to the storage of the process of exceeding four discrete threshold values of an external operating parameter for reasons of better clarity. However, it can be extended as desired and, consequently, enables the storage of a number of exceeded threshold values of an external operating parameter that is optimized toward the respective application purpose.

The integrated circuit includes a programming circuit 10, first controllable switches 21, . . . , 24, a storage circuit 30, second controllable switches 41, . . . , 44 and also output terminals A1, . . . , A4. The programming circuit includes a first input terminal E1 for applying a control voltage ES, a second input terminal E2 for applying a reference voltage Vref and output terminals AP1, . . . , AP4. It furthermore includes a first comparator circuit V1 with a first input terminal 1a, a second input terminal 1b and an output terminal 1c, a second comparator circuit V2 with a first input terminal 2a, a second input terminal 2b and an output terminal 2c, a third comparator circuit V3 with a first input terminal 3a, a second input terminal 3b and an output terminal 3c, a fourth comparator circuit V4 with a first input terminal 4a, a second input terminal 4b and an output terminal 4c. The first input terminal 1a of the first comparator circuit V1 is connected to the input terminal E1 of the programming circuit of the integrated circuit for applying the input signal ES and, via a first resistor R1, to the first input terminal 2a of the second comparator circuit V2. The first input terminal 2a of the second comparator circuit V2 is connected to the first input terminal 3a of the third comparator circuit V3 via a second resistor R2. The first input terminal 3a of the third comparator circuit V3 is connected to the first input terminal 4a of the fourth comparator circuit V4 via a third resistor R3. The first input terminal 4a of the fourth comparator circuit V4 is connected to the terminal for applying a reference potential via a fourth resistor R4. The first input terminals 1a, . . . , 4a of the first, second, third and fourth comparator circuits V1, . . . , V4 are formed as noninverting input terminals of the respective comparator circuit V1, . . . , V4. The second input terminals 1b, . . . , 4b of the first, second, third and fourth comparator circuits are formed as inverting input terminals of the respective comparator circuit V1, . . . , V4 and are connected to the second input terminal of the programming circuit 10 for applying the reference voltage Vref.

The first output terminal $1_c$ of the first comparator circuit is connected to a programming terminal P1 of the storage circuit 30 via an output terminal AP1 of the programming circuit 10 and via a controllable switch 21. The second output terminal 2c of the second comparator circuit is connected to a programming terminal P2 of the storage circuit 30 via an output terminal AP2 of the programming circuit 10 and via a controllable switch 22. The third output terminal 3c of the third comparator circuit is connected to a programming terminal P3 of the storage circuit 30 via an output terminal AP3 of the programming circuit 10 and via a controllable switch 23. The fourth output terminal 4c of the fourth comparator circuit is connected to a programming terminal P4 of the storage circuit 30 via an output terminal AP4 of the programming circuit 10 and via a controllable switch 24. The controllable switches 21, . . . , 24 can be controlled via a common control terminal S1 by the application of a control signal SS1.

The storage circuit 30 includes third switches 31, . . . , 34, which can be driven by means of a control terminal S3 for applying a control signal SS3. Furthermore, the storage circuit 30 includes programmable nonvolatile switches 35, . . . , 38, to which a respective programming signal PS1, . . . , PS4 is fed via a respective one of the programming terminals P1, . . . , P4. An input terminal Vin for applying a supply voltage VDD is connected to a respective output terminal AS1, . . . , AS4 via a respective one of the third controllable switches 31, . . . , 34. Furthermore, the input terminal Vin for applying the supply voltage VDD is connected to a terminal M for applying the reference potential via the series circuit including a respective one of the third controllable switches 31, . . . , 34 and a respective one of the programmable switches 35, . . . , 38. A respective one of the output terminals AS1, . . . , AS4 of the storage circuit 30 is connected to the terminal M for applying the reference potential via a respective programmable switch 35, . . . , 38. A respective one of the output terminals AS1, . . . , AS4 of the storage circuit 30 is connected to a respective one of the output terminals A1, . . . , A4 of the integrated circuit via a respective second controllable switch 41, . . . , 44.

The input terminal E1 of the programming circuit 10 is formed as a terminal for applying a control voltage. If the integrated circuit is intended to be used to ascertain the exceeding of preset threshold values of the supply voltage, then the supply voltage can be applied directly to the input terminal E1 of the programming circuit 10. If the integrated circuit is intended to be used to ascertain the exceeding of preset threshold values of the clock frequency or the chip temperature, then these operating parameters have to be converted into an electrical output variable, for example an output voltage. A signal converter circuit 50 is provided for converting a nonelectrical information item contained in an input signal ES' into an output voltage. The signal converter circuit 50 includes an input terminal EW for applying the input signal ES' containing a nonelectrical information item. The signal converter circuit 50 converts the nonelectrical information item of the input signal ES' into an output voltage and feeds the latter via its output terminal AW as control signal ES to the input terminal E1 of the programming circuit 10.

The functioning of the integrated circuit for storing external operating parameters will be explained below. For the sake of simplicity, it is assumed that the integrated circuit is formed in such a way that it enables the storage of the exceeding of discrete steps of the supply voltage which is applied to the input terminal E1 of the programming circuit 10 and lies above a permissible maximum value of the maximum voltage specified in the specification. Since a voltage is used as the input variable, the signal converter circuit 50 is obviated in this embodiment, with the result that the supply voltage is applied directly as control voltage to the input terminal E1 of the programming circuit 10. The individual resistors R1, R2, R3 and R4 are dimensioned in such a way that, upon application of a supply voltage which lies above a specific threshold value above the maximum voltage specified in the specification, a first portion of the comparator circuits V1, . . . , V4 generate a programming signal at their respective output terminals 1c, . . . , 4c. The rest of the comparator circuits V1, . . . , V4 do not generate a programming signal at their respective output terminals.

In order to better illustrate the dimensioning of the resistors R1, . . . , R4, a description is given below of the order of magnitude to be chosen for the individual resistors R1, . . . , R4 in order that the comparator circuits V1, . . . , V4 generate corresponding programming signals at their output terminals in a manner dependent on a supply voltage lying 10%, 20%, 30% or 40% above the maximum permissible supply voltage.

The total resistance of the series circuit formed from the first resistor R1, the second resistor R2, the third resistor R3 and the fourth resistor R4 can be chosen freely. The first resistor R1 is dimensioned in such a way that the second comparator circuit generates a programming signal PS2 at its output terminal 2c if the supply voltage applied to the input terminal E1 of the programming circuit 10 lies 20% above the maximum supply voltage that is permissible in accordance with the specification. The second resistor R2 is dimensioned in such a way that the third comparator circuit generates a programming signal PS3 at its output terminal 3c if the supply voltage applied to the input terminal E1 of the programming circuit 10 lies 30% above the maximum supply voltage that is permissible in accordance with the specification. The third resistor R3 is dimensioned in such a way that the fourth comparator circuit generates a programming signal PS4 at its output terminal 3c if the supply voltage applied to the input terminal E1 of the programming circuit 10 lies 40% above the maximum supply voltage that is permissible in accordance with the specification. The fourth resistor R4 is calculated from the remaining residual resistance of the freely selectable total resistance that is formed from the series circuit comprising the first, second, third and fourth resistors.

For setting the reference voltage Vref, the output terminal of the first comparator circuit V1 is connected to the output terminal A1 of the integrated circuit via the controllable switch 41. A voltage lying 10% above the permissible maximum voltage is applied to the input terminal E1 of the programming circuit 10. The reference voltage Vref is subsequently set in such a way that a programming signal is generated at the output terminal A1 of the integrated circuit, which is connected to the output terminal 1c of the first comparator circuit V1. The reference voltage Vref thus lies precisely at the switching threshold of the first comparator circuit V1. Afterward, the controllable switch 41 is opened by means of the control signal SS2 present at its control input S2, with the result that the output terminal 1c of the first comparator circuit V1 is no longer connected to the output terminal A1 of the integrated circuit.

The controllable switches 21, . . . , 24 are closed by means of the control signal SS1 present at the control terminal S1, with the result that a respective one of the output terminals AP1, . . . , AP4 of the programming circuit 10 is connected to a respective one of the programmable switches 35, . . . , 38 via the programming terminals P1, . . . , P4 of the storage circuit 30. If a supply voltage lying 10% above the permissible maximum supply voltage is present at the input terminal E1 of the programming circuit 10, then a programming signal PS1 is generated at the output terminal 1c of the first comparator circuit V1, which programming signal closes the programmable switch 38 and, consequently, the output terminal AS1 of the storage circuit switches permanently to the reference potential M. Correspondingly, at supply voltages lying 20%, 30% or 40% above the permissible maximum supply voltage, programming signals PS2, PS3 and PS4 are generated at the output terminals 2c, 3c and 4c of the comparator circuits V2, V3 and V4, which programming signals respectively close the programmable switches 35, 36 and 37 and, consequently, the output terminals AS2, AS3 and AS4 of the storage circuit switch permanently to the reference potential M. The programmable switches 35, . . . , 38 are formed for example as fusible links or as electrically programmable nonvolatile memory elements, for example as EEPROMs. On the basis of the programming state of the programmable switches, it is subsequently possible to check the operating conditions under which a semiconductor chip on which the integrated circuit is situated was used.

In order to read out the programming state of the programmable switches 35, . . . , 38, the output terminals AP1, . . . , AP4 of the programming circuit 10 are isolated from the programming terminals P1, . . . , P4 by the application of the control signal SS1 to the control terminal S1 of the controllable switches 21, . . . , 24. A supply voltage VDD is applied to the input terminal Vin of the storage circuit 30. Afterward, the controllable switches 31, . . . , 34 are closed by the application of a control signal SS3 to the control terminal S3, with the result that the input terminal Vin for applying the supply voltage VDD is connected to a respective one of the programmable switches 35, . . . , 38. By means of the control signal SS2 present at the control terminal S2 of the controllable switches 41, . . . , 44, the input terminal Vin for applying the supply voltage VDD is connected to a respective one of the output terminals A1, . . . , A4 of the integrated circuit and is simultaneously connected, depending on the switching state of the programmable switches, to the terminal M for applying the reference potential, which is formed for example as a terminal for applying a ground potential VSS. If the programming state of one of the programmable switches 35, . . . , 38 is such that the programmable switch is open, then the output terminal A1, . . . , A4 of the integrated circuit that is connected to the respective programmable switch is connected to the supply potential VDD via a respective one of the switches 31, . . . , 34. A signal corresponding to the logic state 1 is then present at the respective output terminal A1, . . . , A4 of the integrated circuit. If the programming state of one of the programmable switches 35, . . . , 38 is such that the programmable switch is closed then the output terminal A1, . . . , A4 of the integrated circuit that is connected to the respective programmable switch is connected to the ground potential. A signal corresponding to the logic state 0 is then present at the respective output terminal A1, . . . , A4 of the integrated circuit. The signals present at the output terminals A1, . . . , A4 of the integrated circuit thus contain an item of information about the operating conditions under which the integrated semiconductor chip on which the integrated circuit is situated has been operated.

Figure 2:
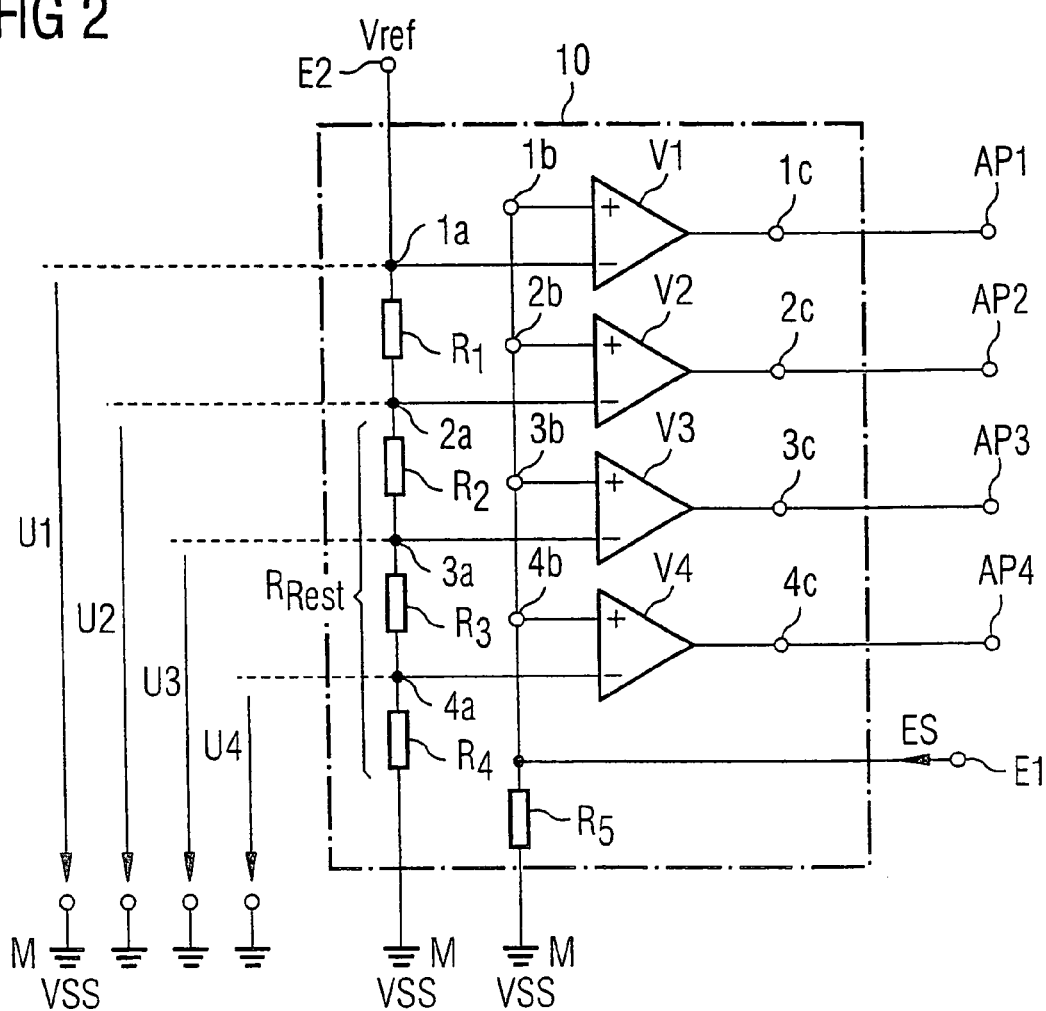
FIG. 2 shows an exemplary embodiment of the programming circuit of the integrated circuit according to the invention.

FIG. 2 shows a second embodiment of the programming circuit 10. Like the first exemplary embodiment illustrated in FIG. 1, the programming circuit 10 includes a first input terminal E1 for applying a control voltage ES, a second input terminal E2 for applying a reference voltage Vref and output terminals AP1, . . . , AP4 for generating programming signals. The programming circuit 10 further includes a first comparator circuit V1 with a first input terminal 1a, a second input terminal 1b and an output terminal 1c, a second comparator circuit V2 with a first input terminal 2a, a second input terminal 2b and an output terminal 2c, a third comparator circuit V3 with a first input terminal 3a, a second input terminal 3b and an output terminal 3c and a fourth comparator circuit V4 with a first input terminal 4a, a second input terminal 4b and an output terminal 4c. The first input terminal 1a of the first comparator circuit V1 is connected to the input terminal E2 of the programming circuit for applying the reference voltage Vref and, via a first resistor R1, to the first input terminal 2a of the second comparator circuit V2. The first input terminal 2a of the second comparator circuit is connected to the first input terminal 3a of the third comparator circuit via a second resistor R2. The first input terminal 3a of the third comparator circuit is connected to the first input terminal 4a of the fourth comparator circuit via a third resistor R3. The first input terminal 4a of the fourth comparator circuit is connected to the terminal for applying the reference potential via a fourth resistor R4. The first input terminals 1a, . . . , 4a of the first, second, third and fourth comparator circuits are formed as inverting input terminals of the respective comparator circuits V1, . . . , V4. The second input terminals 1b, . . . , 4b of the first, second, third and fourth comparator circuits are formed as noninverting input terminals of the respective comparator circuits V1, . . . , V4 and are connected to the first input terminal E1 of the programming circuit 10 for applying the input signal ES. The second input terminals 1b, . . . , 4b of the first, second, third and fourth comparator circuits V1, . . . , V4 are connected together with the first input terminal E1 of the programming circuit to the terminal M for applying the reference potential via a resistor R5.

In contrast to the exemplary embodiment shown in FIG. 1, the value of the reference voltage Vref corresponds to the maximum threshold value—converted into a voltage—of an operating parameter which, when exceeded, means that the comparator circuit V1 generates a programming signal at its output terminal 1c. The resistors R1, . . . , R4 are chosen in such a way that a voltage corresponding to a threshold value of an operating parameter that is to be monitored is dropped at in each case the first input terminal 1a, . . . , 4a of the comparator circuits V1, . . . , V4. If a control voltage ES lying above the threshold voltage present at the first input terminal of the comparator circuit occurs at the second input terminal of one of the comparator circuits, then the comparator circuit generates a programming signal at its output terminal. If a control voltage ES lying below the threshold voltage present at the first input terminal of the comparator circuit occurs at the second input terminal of one of the comparator circuits, then the comparator circuit does not generate a programming signal at its output terminal.

Figure 3A:
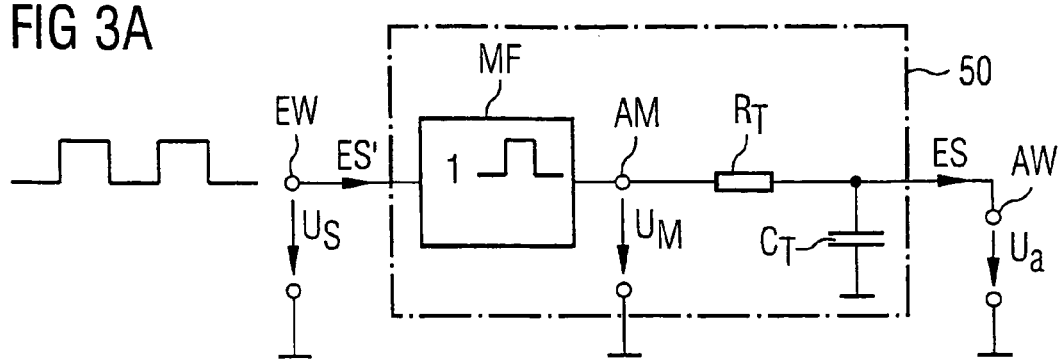
FIG. 3A shows a first exemplary embodiment of a signal converter circuit according to the invention.

FIG. 3A shows a first embodiment of the signal converter circuit 50. The signal converter circuit 50 includes a monostable multivibrator MF, to which an input signal ES' is fed via an output terminal EW. The monostable multivibrator MF is connected to a low-pass filter via its output terminal AM. The low-pass filter includes a resistor $R_T$ connected to the output terminal AW of the signal converter circuit 50 for generating the control voltage ES, which is fed to the programming circuit 10 illustrated in FIGS. 1 and 2. Furthermore, the resistor $R_T$ is connected to the terminal M for applying a ground reference potential VSS via a capacitance $C_T$. The input signal ES' is present in the form of the input voltage $U_S$ at the input terminal EW of the signal converter circuit 50. The monostable multivibrator generates the output voltage $U_M$ at the output terminal AM of the monostable multivibrator MF. After filtering of the output voltage $U_M$ of the monostable multivibrator, the output voltage $U_A$ occurs at the output terminal AW of the signal converter circuit 50.

Figure 3B:
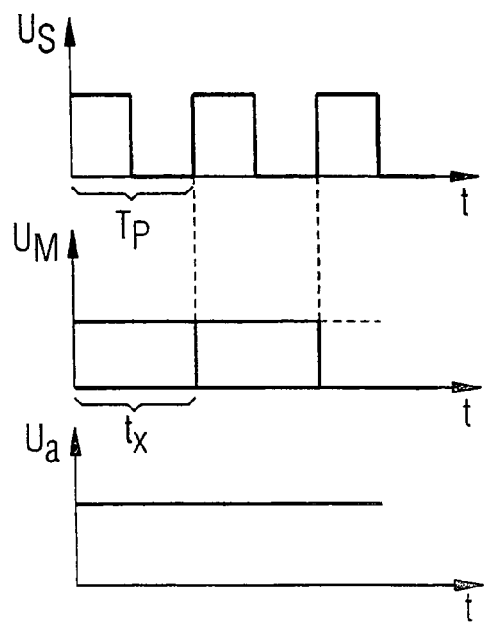
FIG. 3B shows the profile of the monostable multivibrator voltage $U_M$ and the output voltage $U_A$ of the signal converter circuit at a high frequency of the input voltage $U_S$ of the signal converter circuit in accordance with FIG. 3A.
Figure 3C:
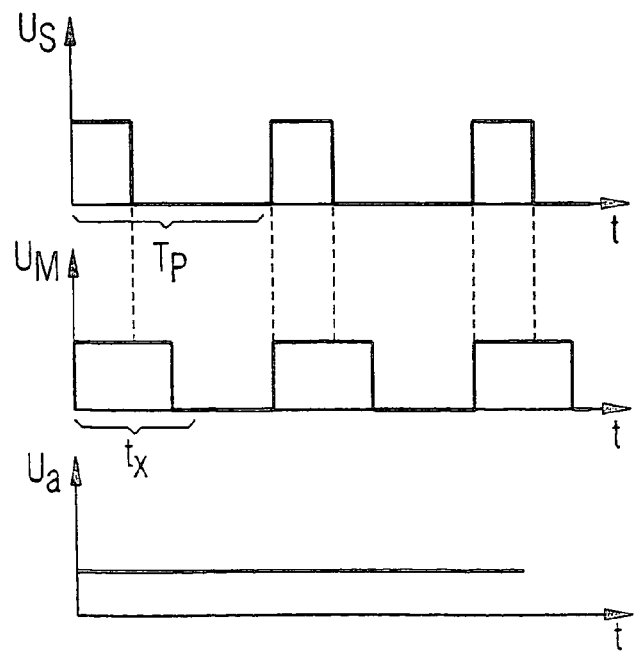
FIG. 3C shows the profile of the monostable multivibrator voltage $U_M$ and the output voltage $U_A$ of the signal converter circuit at a low frequency of the input voltage $U_S$ of the signal converter circuit in accordance with FIG. 3A.

FIGS. 3B and 3C show the profile of the three voltages $U_S$, $U_M$ and $U_A$ against time t for different frequencies of the voltage $U_S$ present at the input terminal EW. The voltage $U_S$ is illustrated as a rectangular voltage with the period duration $T_P$ in the first diagram of FIG. 3B. As shown in the second diagram of FIG. 3B, the monostable multivibrator MF toggles into the nonstable state after application of the input signal ES' in the form of the rectangular voltage $U_S$ for the duration $T_P$ and generates the output voltage $U_M$ at its output terminal AM. After the time $t_X$ has elapsed, the monostable multivibrator toggles into the stable state again, but is forced into the nonstable state again by the renewed occurrence of the subsequent rectangular pulse. Since the time $t_X$ during which the monostable multivibrator is in the unstable state is identical to the period duration $T_P$ of the voltage $U_S$, a constant voltage $U_M$ occurs at the output terminal AM of the monostable multivibrator MF and charges the capacitor $C_T$ of the low-pass filter that is connected downstream to the constant voltage $U_A$. The profile of the output voltage $U_A$ is illustrated in the third diagram of FIG. 3B.

FIG. 3C illustrates the profile of the voltage $U_M$ and $U_A$ for a rectangular voltage $U_S$ having a lower frequency than for the profile shown in FIG. 3B. The first diagram of FIG. 3C shows the rectangular profile of the voltage $U_S$ with a longer period duration $T_P$ than is illustrated in the first diagram of FIG. 3B. Since the time $t_X$ is shorter than the period duration T of the input voltage $U_S$, the monostable multivibrator MF does not generate a voltage signal at its output AM during the time $T_P-t_X$. The low-pass filter connected downstream charges the capacitor $C_T$ to a constant voltage $U_A$ that is lower than the voltage $U_A$ that occurs in the exemplary embodiment of FIG. 3B. The output voltage $U_A$, which is depicted in the third diagram of FIG. 3C, is proportional to the frequency of the input signal ES' in the case of the embodiment of the signal converter circuit 50 that is illustrated in FIG. 3A.

Figure 4A:
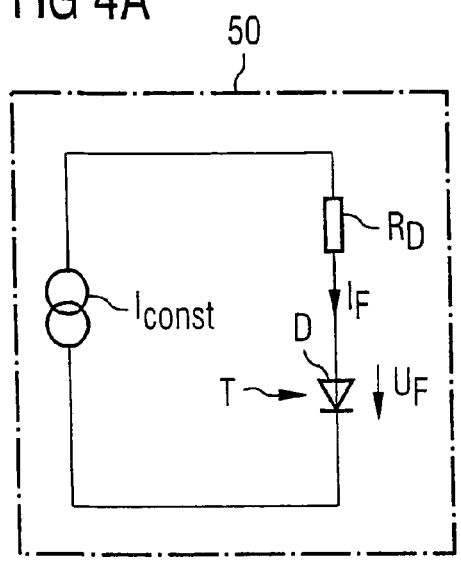
FIG. 4A shows a second exemplary embodiment of a signal converter circuit according to the invention.

FIG. 4A shows a second embodiment of the signal converter circuit 50, which converts a temperature, for example the ambient temperature T at which a diode D is operated, into an electrical signal. The signal converter circuit 50 illustrated in FIG. 4A includes a constant-current source that generates the constant current $I_{const}$ and is connected to the series circuit including a resistor $R_D$ and a diode D. If the diode D is operated in the forward range, the forward voltage $U_F$ is dropped across it when the forward current $I_F=I_{const}$ is applied.

Figure 4B:
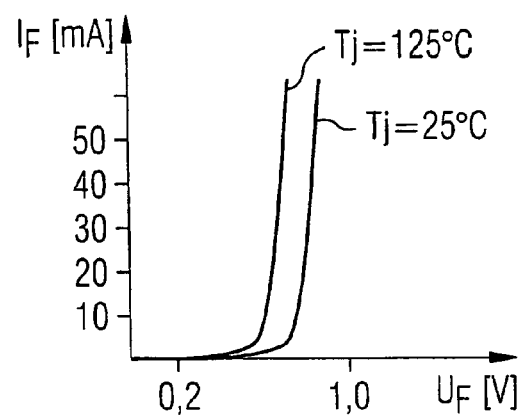
FIG. 4B shows a first current/voltage diagram as a function of the ambient temperature of the signal converter circuit in accordance with FIG. 4A.

FIG. 4B shows a current/voltage diagram for the circuit 50 of FIG. 4A, illustrating the profile of the forward current $I_F$ against the forward voltage $U_F$ for an ambient temperature T=25° C. and T=125° C. For increasing temperatures, the voltage $U_F$ decreases and so does the threshold voltage of the diode. The threshold voltage changes at approximately 2 mV/K and is indirectly proportional to the ambient temperature T of the diode. Thus, the relative change in the ambient temperature can be determined by way of the change in the threshold voltage of the diode.

Figure 4C:
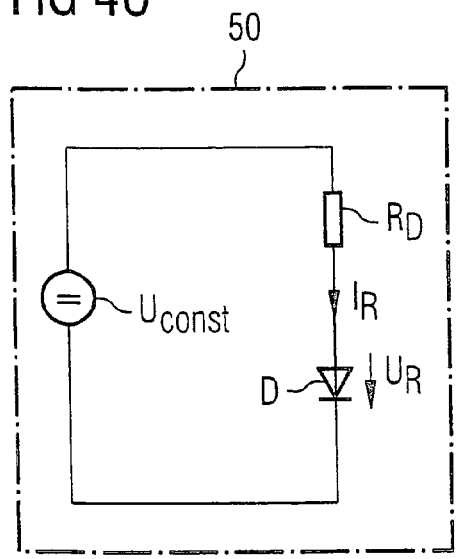
FIG. 4C shows a third exemplary embodiment of a signal converter circuit according to the invention.

FIG. 4C shows a third embodiment of the signal converter circuit 50 for converting the ambient temperature into an electrical signal. The construction of the circuit is identical to the embodiment of the signal converter circuit that is shown in FIG. 4A except for the use of a constant-voltage source that generates the constant voltage $U_{const}$ (i.e., instead of the use of the constant-current source as in the circuit of FIG. 4A). Further, the diode D of the circuit of FIG. 4C is operated in the reverse range in the case of the third embodiment. In this operating state, the reverse current $I_R$ flows via the diode when a constant reverse voltage $U_R$ is applied.

Figure 4D:
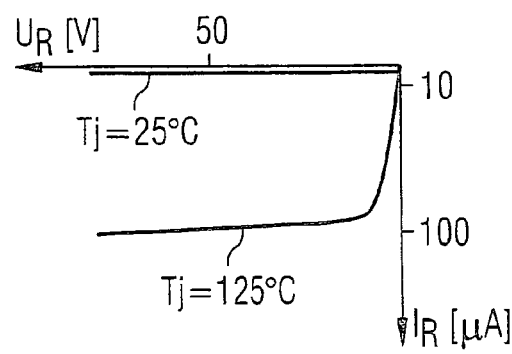
FIG. 4D shows a second current/voltage diagram as a function of the ambient temperature of the signal converter circuit in accordance with FIG. 4C.

FIG. 4D shows the current/voltage diagram that is associated with FIG. 4C and illustrates the profile of the reverse current $I_R$ against the reverse voltage $U_R$. When a constant reverse voltage is applied, which is prescribed by the constant-voltage source, the reverse current $I_R$ flows through it. The reverse current increases as the temperature increases and is thus directly proportional to the ambient temperature of the diode. In the case of this method, the relative change in the ambient temperature can be determined by way of the change in the reverse current of the diode.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1a, . . . , 4a First input terminals of the comparator circuits
1b, . . . , 4b Second input terminals of the comparator circuits
1c, . . . , 4c Output terminals of the comparator circuits
10 Programming circuit
21, . . . , 24 First controllable switches
30 Storage circuit
31, . . . , 34 Third controllable switches
35, . . . , 38 Programmable switches
41, . . . , 44 Second controllable switches
50 Signal converter circuit
A Output terminal of the integrated circuit
AP Output terminal of the programming circuit
AS Output terminal of the storage circuit
AW Output terminal of the signal converter circuit
D Diode
E Input terminal of the programming circuit
ES Control voltage of the programming circuit
ES' Input signal of the signal converter circuit
EW Input terminal of the signal converter circuit
M Terminal for applying the reference potential
P Programming terminal of the storage circuit
PS Programming signal
R Resistor
S Control terminal of the controllable switches
SS Control signal for driving the controllable switches
V1, . . . , V4 Comparator circuits
Vin Terminal for applying the supply potential
Vref Reference voltage of the programming circuit

What is claimed is:

1. An integrated circuit for storing operating parameters, comprising:
   a programming circuit comprising a first input terminal to apply a control voltage, a second input terminal to apply a reference voltage and a plurality of output terminals, each output terminal of the programming circuit being configured to generate a respective programming signal;
   a plurality of first controllable switches;
   a storage circuit comprising a plurality of programming terminals, a plurality of output terminals, and a plurality of programmable elements that are selectively controlled to different settings;
   a plurality of second controllable switches; and
   a plurality of output terminals of the integrated circuit;
   wherein:
      each of the output terminals of the programming circuit are connectable, via a respective one of the first controllable switches, with a respective one of the programming terminals of the storage circuit to facilitate the generation of programming signals;
      each of the output terminals of the storage circuit are connectable, via a respective one of the second controllable switches, to a respective one of the output terminals of the integrated circuit;
      the number of programming signals generated is dependent upon the magnitude of the control voltage; and
      each of the programmable elements of the storage circuit is programmable to a selected setting based upon the generation of programming signals.

2. The integrated circuit of claim 1, wherein the first input terminal of the programming circuit comprises a terminal configured to apply a supply potential.

3. The integrated circuit of claim 1, further comprising:
   a signal converter circuit comprising an input terminal to apply an input signal and an output terminal to generate an output voltage, wherein the output terminal of the signal converter circuit is connected to the first input terminal of the programming circuit to facilitate the application of the control signal, and the signal converter circuit converts an information item contained in the input signal into the output voltage and feeds the output voltage to the output terminal.

4. The integrated circuit of claim 3, wherein the signal converter circuit comprises a temperature sensor to record a temperature of the integrated circuit, and the signal converter circuit is configured to generate the output voltage such that the output voltage is dependent on the temperature of the integrated circuit at the output terminal.

5. The integrated circuit of claim 3, wherein the input terminal of the signal converter circuit applies a clock signal of the integrated circuit, and the signal converter circuit is configured to generate the output voltage such that the output voltage is dependent on a frequency of the clock signal of the integrated circuit at the output terminal.

6. The integrated circuit of claim 1, wherein the programming circuit further comprises a first comparator circuit and a second comparator circuit, each of the first and second comparator circuits includes a first input terminal, a second input terminal and an output terminal, the first input terminal of the first comparator circuit is connected to a terminal that applies a reference potential via a series circuit, the series circuit comprising a first resistor and a second resistor, the first input terminal of the second comparator circuit is connected to the first input terminal of the first comparator via the first resistor and to the terminal that applies the reference potential via the second resistor, and the output terminal of each of the first and second comparator circuits is connected to a respective one of the output terminals of the programming circuit.

7. The integrated circuit of claim 6, wherein the reference potential that is applied by the terminal via the series circuit is a ground potential.

8. The integrated circuit of claim 6, wherein the first input terminal of each of the first and second comparator circuits applies a respective partial voltage of the control voltage, the first input terminal of the first comparator circuit is connected to the first input terminal of the integrated circuit to apply the control voltage of the programming circuit, the second input terminal of each of the first and second comparator circuits is connected to the terminal that applies the reference voltage via the series circuit of the programming circuit, and each of the first and second comparator circuits generates a respective programming signal at its output terminal when the respective partial voltage of the control voltage that is present at its first input terminal exceeds the reference voltage present at its second input terminal.

9. The integrated circuit of claim 8, wherein the first input terminal of each of the first and second comparator circuits comprises a noninverting terminal, and the second input terminal of each of the first and second comparator circuits comprises an inverting terminal.

10. The integrated circuit of claim 6, wherein the first input terminal of each of the first and second comparator circuits applies a respective partial voltage of the reference voltage, the first input terminal of the first comparator circuit is connected to the terminal that applies the reference voltage via the series circuit of the programming circuit, the second input terminal of each of the first and second comparator circuits is connected to the first input terminal of the programming circuit, and each of the first and second comparator circuits generates a respective programming signal at its output terminal when the respective partial voltage of the reference voltage that is present at its first input terminal exceeds the control voltage present at its second input terminal.

11. The integrated circuit of claim 10, wherein the first input terminal of each of the first and second comparator circuits comprises an inverting terminal, and the second input terminal of each of the first and second comparator circuits comprises a noninverting terminal.

12. The integrated circuit of claim 1, wherein the storage circuit further comprises a terminal that applies a supply voltage, a plurality of third controllable switches, and a plurality of terminals that apply a reference potential, the terminal that applies the supply voltage is connectable to each of the plurality of terminals that apply the reference potential via a respective series circuit, each series circuit comprises a respective one of the third controllable switches and a respective one of the programmable elements, and each of the output terminals of the storage circuit is connectable to a respective terminal that applies the reference potential via a respective one of the programmable elements.

13. The integrated circuit of claim 1, wherein at least one of the output terminals of the programming circuit is connected to at least one of the output terminals of the integrated circuit via at least one of the second controllable switches.

14. The integrated circuit of claim 1, wherein the programmable elements comprise electrically programmable nonvolatile memory elements.

15. The integrated circuit of claim 1, wherein the programmable elements comprise fusible links.

* * * * *